(12) United States Patent
Hein

(10) Patent No.: US 8,432,175 B2
(45) Date of Patent: Apr. 30, 2013

(54) SYSTEM AND METHOD FOR EVALUATING VEHICLE CHARGING CIRCUITS

(75) Inventor: David A. Hein, Sterling Heights, MI (US)

(73) Assignee: Lear Corporation, Southfield, MI (US)

( * ) Notice: Subject to any disclaimer, the term of this patent is extended or adjusted under 35 U.S.C. 154(b) by 359 days.

(21) Appl. No.: 12/979,015

(22) Filed: Dec. 27, 2010

(65) Prior Publication Data

US 2012/0161797 A1 Jun. 28, 2012

(51) Int. Cl.
*G01R 27/08* (2006.01)

(52) U.S. Cl.
USPC .................................................. 324/705

(58) Field of Classification Search .......... 324/705, 324/713
See application file for complete search history.

(56) References Cited

U.S. PATENT DOCUMENTS

| 5,467,006 | A | 11/1995 | Sims |
| 5,748,008 | A | 5/1998 | Landreth |
| 7,688,024 | B2 | 3/2010 | Kamaga |
| 2006/0028178 | A1 | 2/2006 | Hobbs |
| 2006/0119368 | A1 | 6/2006 | Sela et al. |
| 2009/0277705 | A1 | 11/2009 | Ichikawa |
| 2009/0278547 | A1 | 11/2009 | Acena et al. |
| 2009/0301801 | A1 | 12/2009 | Fujitake |
| 2010/0010704 | A1 | 1/2010 | Uchida |
| 2010/0017045 | A1 | 1/2010 | Nesler et al. |
| 2010/0269776 | A1* | 10/2010 | Mizuno ............ 123/179.4 |

FOREIGN PATENT DOCUMENTS

WO 2010049775 A2 5/2010

OTHER PUBLICATIONS

SAE International, SAE Electric Vehicle and Plug in Hybrid Electric Vehicle Conductive Charge Coupler J1772, Issued: Oct. 1996, Revised Aug. 2009, Superseding Nov. 2001.

* cited by examiner

*Primary Examiner* — Vincent Q Nguyen
(74) *Attorney, Agent, or Firm* — Brooks Kushman P.C.

(57) ABSTRACT

A system and method is provided for evaluating performance of a supply circuit for electric vehicle charging. An electrical connection is established between a vehicle circuit and a supply circuit for an external Alternating Current (AC) power supply. The electrical connection includes a hot, neutral, and ground conductor. A control signal is transmitted to activate a switch disposed along the electrical connection for selectively initiating vehicle charging. Input signals are received including: a line current signal indicative of a current along at least one of the hot conductor and the neutral conductor, and at least one of a line voltage signal and a neutral voltage signal. The line voltage signal being indicative of a voltage potential between the hot conductor and the neutral conductor. The neutral voltage signal being indicative of a voltage potential between the neutral conductor and the ground conductor. At least one of the input signals is compared to predetermined resistance data for evaluating supply circuit performance.

20 Claims, 4 Drawing Sheets

SYSTEM AND METHOD FOR EVALUATING VEHICLE CHARGING CIRCUITS

TECHNICAL FIELD

One or more embodiments relate to a system and method for evaluating performance of charging circuits for electric vehicle charging.

BACKGROUND

One example of a ground-fault detection system for vehicles with a high-voltage power net is US Patent Application Publication No.: 2009/0278547 A1 to Acena et al.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

In general, hybrid-electric and electric vehicles may be connected to an external power supply for charging a vehicle battery. The vehicle may be connected to a residential or commercial building, which receives alternating current (AC) from an external power supply. Unfortunately, residential wiring may have high impedance characteristics. Wiring having high impedance characteristics results in high power dissipation during charging which is inefficient and may lead to a thermal event.

The present invention provides a system and method for monitoring electrical power during charging to evaluate performance of a supply circuit. The system may adjust the charging current in response to the performance.

Figure 1:
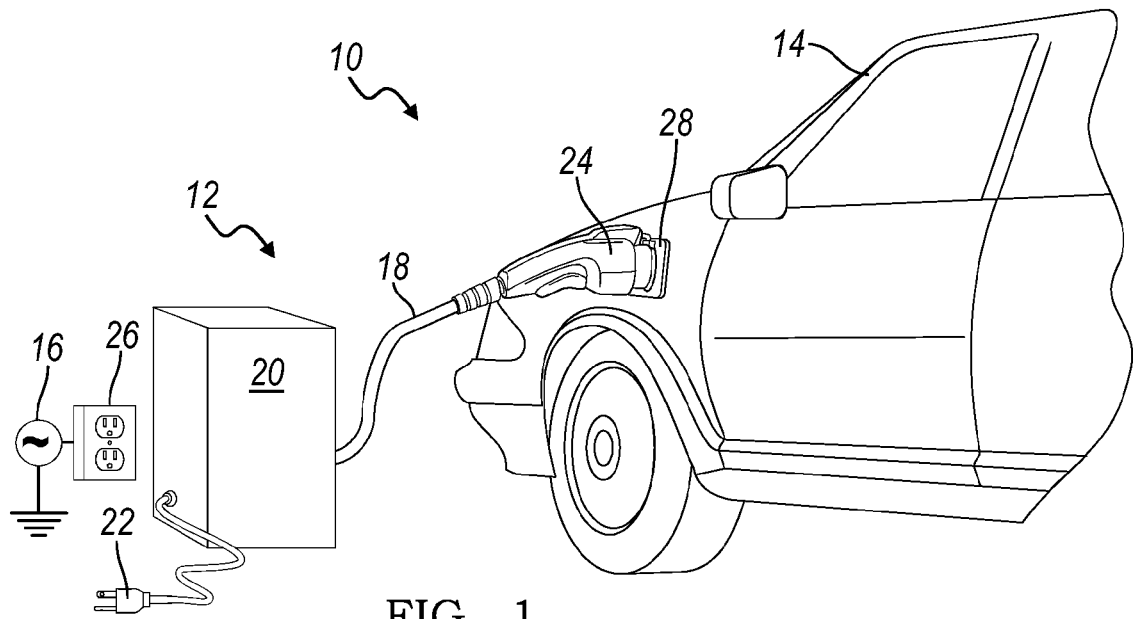
FIG. 1 is a schematic view of a system for evaluating performance of a charging circuit in accordance with an embodiment of the present invention.

With reference to FIG. 1, a system for evaluating performance of a supply circuit for electric vehicle charging is illustrated in accordance with an embodiment and is generally indicated by numeral 10. The system 10 includes a cordset assembly 12 for electrically connecting a vehicle 14 to an external power supply 16.

The cordset assembly 12 includes a charging cable 18 and electric vehicle supply equipment (EVSE) 20. The charging cable 18 includes a plug 22 and a connector 24 attached to opposite ends of the charging cable 18. The EVSE 20 may be disposed along the charging cable 18 between the plug 22 and the connector 24 for monitoring electrical power passing through the cable 18 during charging.

A residential or commercial building such as a home (shown in FIG. 2) includes a series of AC outlets 26 that are electrically connected to the external power supply 16. The AC outlet 26 receives the plug 22 for facilitating vehicle charging. The vehicle 14 includes a vehicle inlet 28 for receiving the connector 24. The connector 24 may include five terminals as specified by the SAE J1772 HEV Conductive Charge Coupler Specification. However, the system 10 contemplates a connector 24 having alternate terminal configurations, which may be specified by other associations.

Figure 2:
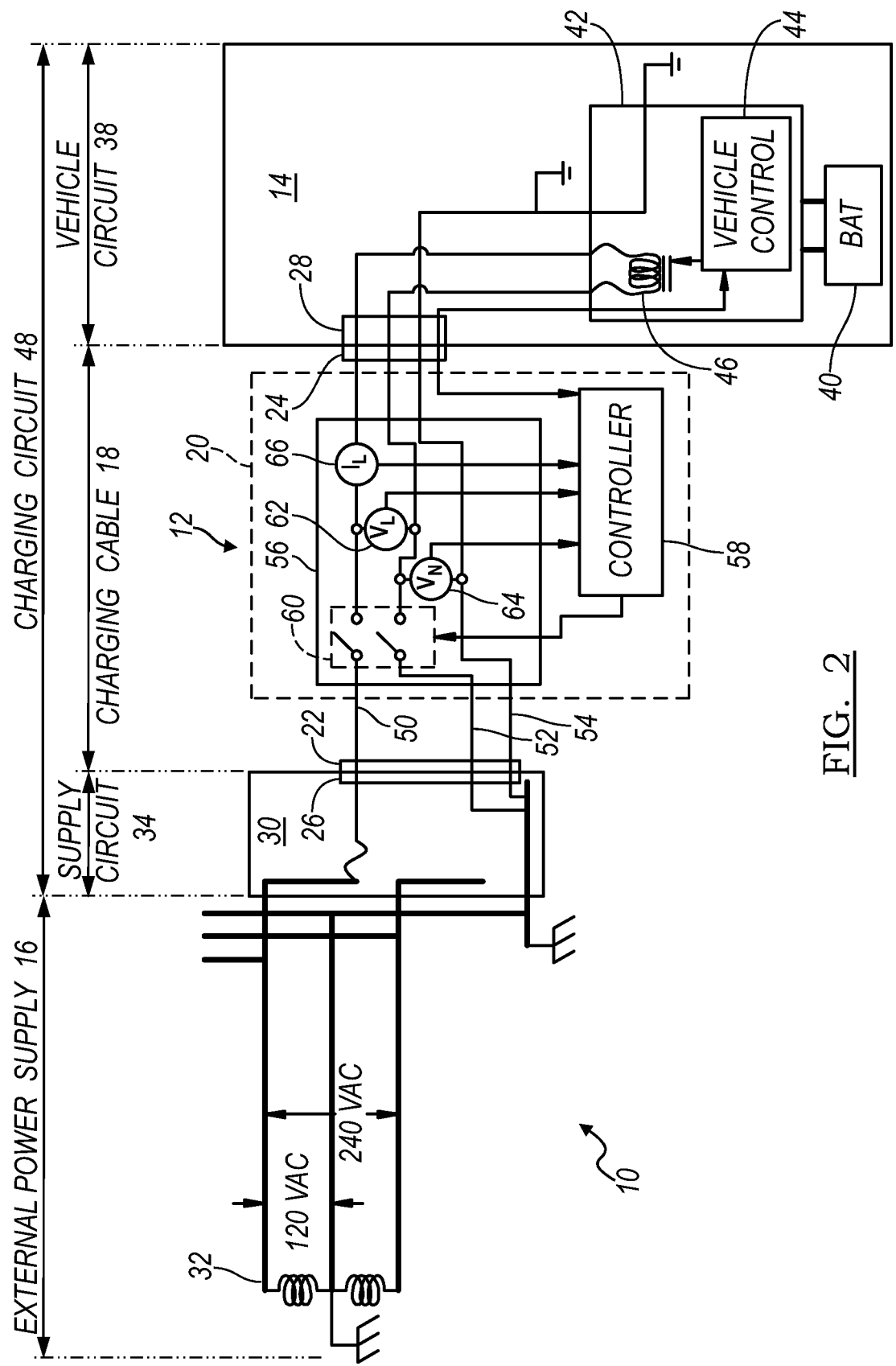
FIG. 2 is a schematic circuit diagram of the system of FIG. 1.

With reference to FIGS. 1 and 2, the external power supply 16 represents an electrical grid that may receive power from an assortment of power sources and transmits AC power along power lines. The external power supply 16 includes transformers 32 which are located next to each home 30. The transformers 32 convert AC power by stepping down the voltage and stepping up the current to provide a three-wire single phase supply voltage of 240 Vrms to each home 30. A distribution panel (not shown) is provided in each home 30 and divides the voltage into two 120 Vrms lines (L1 and L2).

A supply circuit 34 is defined by residential wiring that electrically connects the external power supply 16 to each AC outlet 26 (along L1 or L2). Various other electrical devices (e.g., appliances) may be connected to the supply circuit 34.

A vehicle circuit 38 is defined by vehicle wiring that electrically connects the vehicle inlet 28 to a vehicle battery 40. Electric vehicles 14 may include multiple batteries 40 (e.g., a high voltage battery and a low voltage battery). The vehicle circuit 38 includes an on-board charger 42 disposed between the vehicle inlet 28 and the battery 40 for controlling the electrical power provided to the battery 40. The on-board charger 42 includes a vehicle control 44 and a vehicle transformer 46. The vehicle transformer 46 converts the AC power to direct current (DC). The vehicle control 44 controls the vehicle transformer 46 for setting the amount of charging current received by the vehicle 14.

The supply circuit 34, the charging cable 18, and the vehicle circuit 38 collectively define a charging circuit 48. The wiring along the charging circuit 42 may have different lengths, gages and insulation, which lead to varying line resistances.

The charging cable 18 includes a hot conductor 50, a neutral conductor 52, and a ground conductor 54. Each conductor 50, 52, 54 spans the length of the charging cable 18 between the plug 22 and the connector 24. Each conductor 50, 52, 54 electrically connects with a corresponding conductor of both the supply circuit 34 and the vehicle circuit 38.

The vehicle circuit 38 and the charging cable 18 may include standardized wiring with generally common wire lengths and diameters (gage). Standardized wiring provides generally common line impedance characteristics. However, supply circuits 34 are not standardized, and therefore the line impedance may vary between different homes, and even between L1 and L2 of the same home 30. For example, each conductor of the vehicle circuit 38 and the charging cable 18 may be standardized to have a common gage (e.g., 16 AWG) and a combined length of approximately thirty feet, which results in a combined resistance of 0.151 ohms. However, each conductor of the residential wiring (supply circuit 34) may include a 14 AWG wire with a length between five and one hundred thirty five feet, which results in a line resistance between 0.02 and 0.4 ohms.

Figure 3:
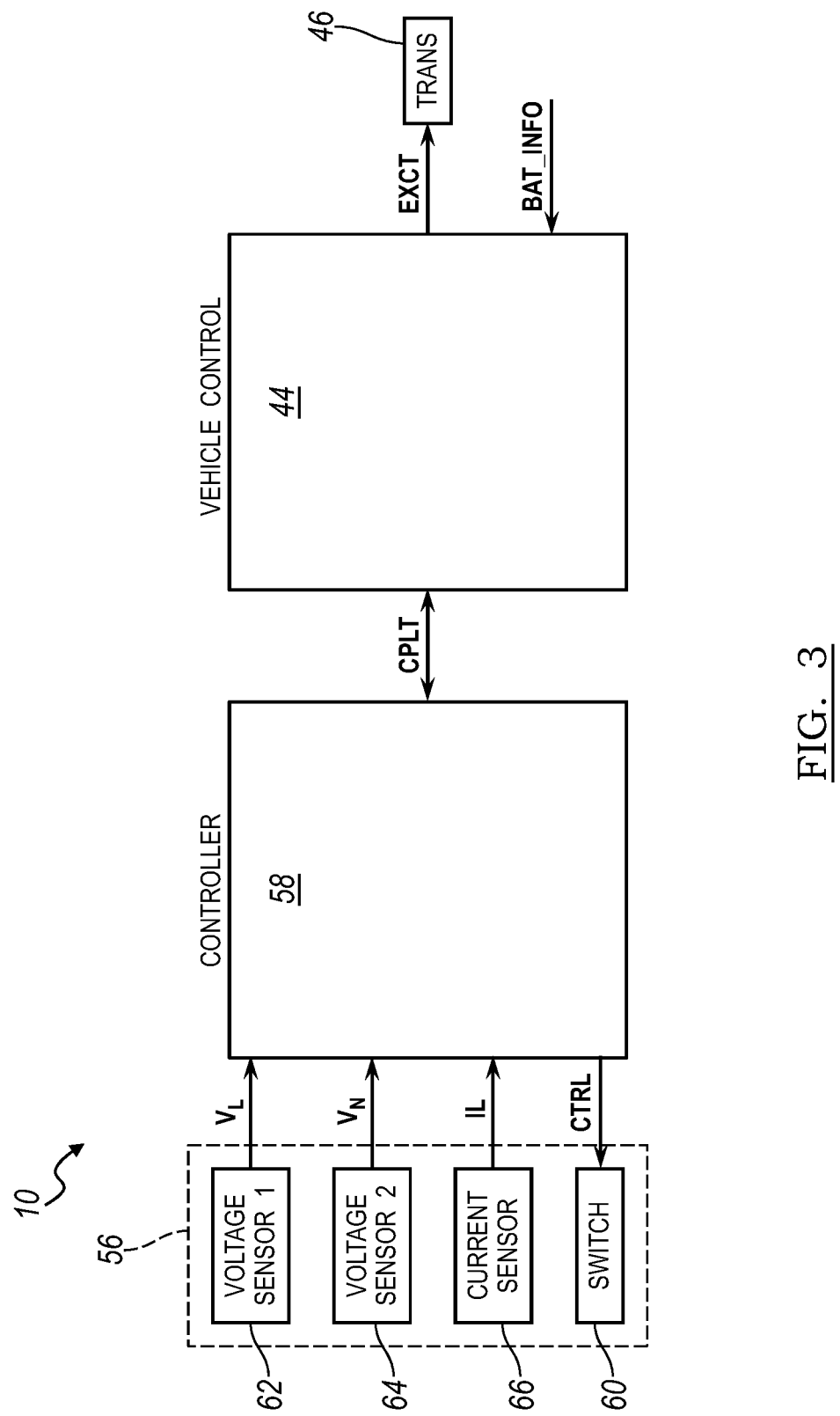
FIG. 3 is a schematic diagram further illustrating the system of FIG. 1.

With reference to FIGS. 2 and 3, the system 10 monitors electrical power in the charging cable 18 in order to evaluate the performance of the supply circuit 34. The EVSE 20 includes a control circuit 56 and a controller 58 electrically connected to each other. The control circuit 56 includes a switch 60 for disconnecting the vehicle circuit 38 from the supply circuit 34. The switch 60 may be disposed along the hot conductor 50, the neutral conductor 52, or both conductors 50, 52. In the illustrated embodiment, the control circuit 56 includes a pair of switches 60, one on each of the hot conductor 50 and the neutral conductor 52. The controller 58 activates the switch 60, between an opened and a closed position, by transmitting a control signal (CTRL). The controller 58 may be hardline connected to the switch 60. The switch 60 may be selected from an assortment of known switch devices (e.g., relays and IGBTs).

The control circuit 56 measures the electrical power flowing through the charging cable 18. The control circuit 56 may include a first voltage sensor 62, a second voltage sensor 64, and a current sensor 66 for measuring the electrical power and providing corresponding signals to the controller 58.

The first voltage sensor 62 measures a line voltage of the charging cable 18. The first voltage sensor 62 provides a line voltage signal (VL) to the controller 58 that is indicative of a voltage potential between the hot conductor 50 and the neutral conductor 52. The first voltage sensor 62 may be hardline connected to the controller 58.

The second voltage sensor 64 measures a neutral voltage of the charging cable 18. The second voltage sensor 64 provides a neutral voltage signal (VN) to the controller 58 that is indicative of a voltage potential between the neutral conductor 52 and the ground conductor 54. The second voltage sensor 64 may be hardline connected to the controller 58.

The current sensor 66 measures a line current of the charging cable 18. The current sensor 66 provides a line current signal (IL) to the controller 58 that is indicative of a current along at least one of the hot conductor 50 and the neutral conductor 52. The current sensor 66 may be hardline connected to the controller 58.

The controller 58 compares at least one of the line voltage signal (VL), the neutral voltage signal (VN), and the line current signal (IL) to predetermined data to evaluate the performance of the charging circuit 48. The controller 58 analyzes voltage and current measurements to calculate resistance values. The controller 58 then compares the calculated resistance values to predetermined resistance data to evaluate the performance of the overall charging circuit 48, and specifically the supply circuit 34.

The controller 58 communicates with the vehicle control 44 for controlling the charging current. The controller 58 and the vehicle control 44 each generally include any number of microprocessors, ASICs, ICs, memory (e.g., FLASH, ROM, RAM, EPROM and/or EEPROM) and software code to co-act with one another to perform a series of operations.

The controller 58 and the vehicle control 44 may communicate with each other by transmitting a pulse-width modulated (PWM) pilot signal (CPLT) over a hardline connection as specified by the SAE J1172 Specification. Once the controller 58 has evaluated the performance of the supply circuit 34, the controller 58 determines an allowable charge value. For example, if the supply circuit 34 has low line resistance, the controller 58 may determine a high allowable charge. However, if the supply circuit 34 has a high line resistance, the controller 58 may determine a low allowable charge, or no charge. Then, the controller 58 transmits the pilot signal (CPLT) that is indicative of the allowable charge to the vehicle control 44.

The vehicle control 44 sets the charging current that is received by the vehicle 14. The vehicle control 44 may receive a plurality of input signals (BAT_INFO) that are indicative of a current state of the battery 40, such as battery voltage, battery current, and battery state of charge (SOC). The vehicle control 44 may be hardline connected to a battery controller (not shown) for receiving the BAT_INFO signal, or the vehicle control 44 may receive BAT_INFO over a vehicle BUS communication network (e.g., CAN). The vehicle control 44 may also receive other vehicle signals indicative of vehicle operating characteristics (e.g., wheel speed, pedal position, etc.).

The vehicle control 44 analyzes the BAT_INFO signal to determine how much current is needed to charge the battery 40. The vehicle control 44 transmits a pilot signal (CPLT) to the controller 58 requesting a charge cycle, if charging is needed. Then the vehicle control 44 receives a pilot signal (CPLT) from the controller 58 that is indicative of the allowable charge. The vehicle control 44 transmits an excitation signal (EXCT) to the vehicle transformer 46 for setting the charging current, in response to the allowable charge.

The controller 58 continues to monitor the electrical power through the control circuit 56 during charging. The controller 58 may later determine a different allowable charge, and send an updated CPLT signal. Additionally, the controller 58 may activate the switch 60 to an opened position, thereby disconnecting the charging circuit 48, in the event that the vehicle control 44 sets a charging current above the allowable charge.

The illustrated embodiment depicts an EVSE 20 containing both the control circuit 56 and the controller 58. Since the control circuit 56 monitors the supply circuit 34, the control circuit 56 is located adjacent the supply circuit 34. However, the system 10 contemplates various locations for the controller 58 outside of the EVSE 20. For example, other embodiments of the system 10 contemplate a controller located within the vehicle, within the home, or external to both the vehicle and the cordset assembly (all not shown). Alternatively, in one embodiment of the system 10, the functionality of the controller and the vehicle control is combined into a single controller (not shown).

Figure 4:
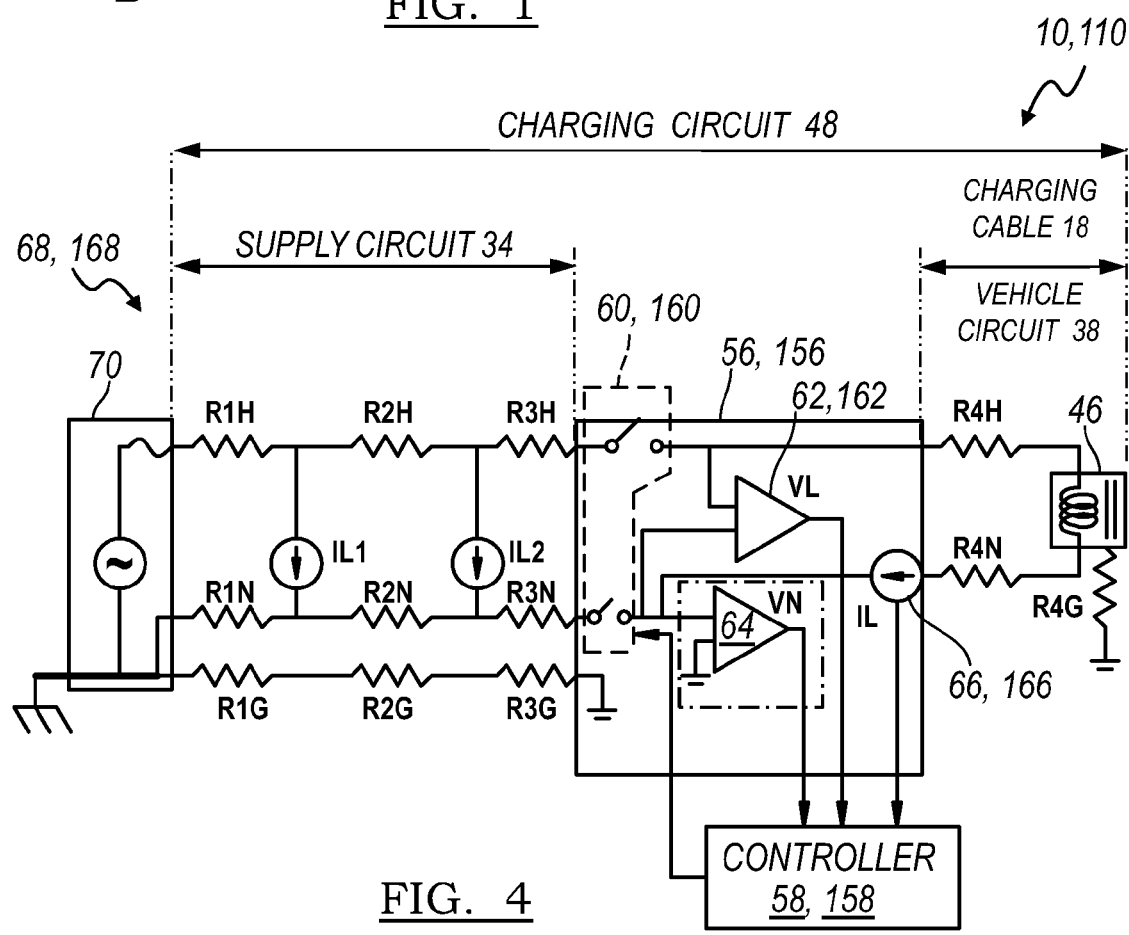
FIG. 4 is an equivalent circuit diagram of the system of FIG. 1 in accordance with embodiments of the present invention.

FIG. 4 illustrates an equivalent circuit 68 of the system 10 for circuit analysis. The equivalent circuit 68 illustrates the line impedances of the circuits between a distribution panel 70 and the vehicle transformer 46, which include: the supply circuit 34, the charging cable 18, and the vehicle circuit 38.

The supply circuit 34 includes residential wiring that electrically connects the distribution panel 70 to each AC outlet 26 (shown in FIGS. 1 and 2). The residential wiring may be configured in a daisy chain configuration, where the wiring from the distribution panel 70 extends to a first outlet 26, and then to each subsequent outlet 26. Each outlet 26 of the supply circuit 34 is electrically connected to a single circuit breaker (not shown) within the distribution panel 70. The equivalent circuit 68 includes two current sources: IL1 and IL2, which represent the current drawn (load current) by appliances (not shown) connected to additional outlets 26 of the supply circuit 34.

With respect to line impedances along the supply circuit 34: resistors (R1H, R1N, and R1G) represent the line resistance between the distribution panel 70 and the first outlet (represented by IL1), along each conductor. Resistors (R2H, R2N, and R2G) represent the line resistance between the first outlet and the second outlet (represented by IL2), along each conductor. And resistors (R3H, R3N, and R3G) represent the line resistance between the second outlet and the charging cable 18, along each conductor.

The line impedances of the charging cable 18 are combined with the line impedances of the vehicle circuit 38 in the equivalent circuit 68, where R4H represents the line resistance of the hot conductors; R4N represents the line resistance of the neutral conductors; and R4G represents the line resistance of the ground conductors.

As mentioned above, the control circuit 56 provides signals indicative of the voltage and current within the charging cable 18. The first voltage sensor 62 measures the line voltage (VL), which is the voltage potential between the hot conductor (H) and the neutral conductor (N). The second voltage sensor 64 measures the neutral voltage (VN), which is the voltage potential between the neutral conductor (N) and the ground conductor (G). The voltage sensors 62, 64 may be selected from a variety of known voltage sensor devices (e.g., operational amplifiers). The current sensor 66 measures line current (IL) along the neutral conductor (N), which is the same as the line current IL along the hot conductor (H). The current sensor 66 may be selected from a variety of known current sensor devices (e.g., shunt or hall-effect sensors). One embodiment of the system 10 includes a voltage sensor for measuring a hot voltage potential (VH) between the hot conductor and the ground conductor (not shown). Other embodiments of the system 10 contemplate using a single voltage sensor, or multiple current sensors (not shown).

The controller 58 may analyze the measurement signals at no load, and load conditions, as well as load conditions overtime to evaluate performance. The controller 58 activates the switch 60 to an opened position, to acquire open circuit, or no load (NL) measurement signals. The controller also activates the switch 60 to a closed position, and commands the vehicle control (not shown) to set a predetermined load (L) or charging current (e.g., 11 A) to acquire load (L) measurement signals.

The controller 58 may determine a total line wiring resistance (RL) by comparing the line voltage (VL) taken when the switch 60 is opened (NL), to the line voltage (VL) and the line current (IL) taken when the switch 60 is closed (L). Equation 1 shown below provides an equation for calculating the total line wiring resistance (RL):

$$RL = \frac{VL_{NL} - VL_L}{IL_L} \qquad \text{Eq. 1}$$

The controller 58 may determine a neutral wiring resistance (RN) by comparing the neutral voltage (VN) taken when the switch 60 is opened (NL), to the neutral voltage (VN) and the line current (IL) taken when the switch 60 is closed (L). Equation 2 shown below provides an equation for calculating the neutral wiring resistance (RN):

$$RN = \frac{VN_{NL} - VN_L}{IL_L} \qquad \text{Eq. 2}$$

The controller 58 may determine a hot wiring resistance (RH) by comparing the calculated total line wiring resistance (RL of Eq. 1) to the calculated neutral wiring resistance (RN of Eq. 2). Equation 3 shown below provides an equation for calculating the hot wiring resistance (RH):

$$RH = RL - RN \qquad \text{Eq. 3}$$

The controller 58 may determine a total line power loss (PL) by comparing the load line current (IL) taken when the switch 60 is closed (L) to the calculated total line wiring resistance (RL of Eq. 1). Equation 4 shown below provides an equation for calculating the total line power loss (PL):

$$PL = (IL^2) * RL \qquad \text{Eq. 4}$$

The controller 58 may determine a hot wiring power loss (PH) by comparing the load line current (IL) taken when the switch 60 is closed (L) to the calculated hot wiring resistance (RH of Eq. 3). Equation 5 shown below provides an equation for calculating the hot wiring power loss (PH):

$$PH = (IL^2) * RH \qquad \text{Eq. 5}$$

The controller 58 may determine a neutral wiring power loss (PN) by comparing the load line current (IL) taken when the switch 60 is closed (L) to the calculated neutral wiring resistance (RN of Eq. 2). Equation 6 shown below provides an equation for calculating the neutral wiring power loss (PN):

$$PN = (IL^2) * RN \qquad \text{Eq. 6}$$

The controller 58 may determine a resistance balance ratio (R_BAL) by comparing the calculated hot wiring resistance (RH of Eq. 3) to the calculated neutral wiring resistance (RN of Eq. 2). Equation 7 shown below provides an equation for calculating the resistance balance ratio (R_BAL):

$$R\_BAL = \frac{RH}{RN} \qquad \text{Eq. 7}$$

The controller 58 may determine a power balance ratio (P_BAL) by comparing the calculated hot wiring power loss (PH of Eq. 5) to the calculated neutral wiring power loss (PN of Eq. 6). Equation 8 shown below provides an equation for calculating the power balance ratio (P_BAL):

$$P\_BAL = \frac{PH}{PN} \qquad \text{Eq. 8}$$

The controller 58 may also analyze the measurement signals overtime to evaluate performance. The controller 58 determines a total line wiring resistance drift (R_DRIFT) by comparing the calculated total line wiring resistance (RL of Eq. 1, at t1) to a second total line wiring resistance taken after a predetermined time interval (RL of Eq. 1, at t2) to determine a total line wiring resistance drift (R_DRIFT). Equation 9 shown below provides an equation for calculating the total line wiring resistance drift (R_DRIFT):

$$R_{DRIFT} = R_{t2} - R_{t1} \qquad \text{Eq. 9}$$

The controller 58 may also use Equation 9 and substitute RN calculated in Equation 2 to determine a neutral wiring resistance drift, or substitute RH calculated in Equation 3 to determine a hot wiring resistance drift.

The controller 58 may determine a total line power loss drift (P_DRIFT) by comparing the calculated total line wiring power loss (PL of Eq. 4, at t1) to a second total line wiring power loss taken after a predetermined time interval (PL of Eq. 4, at t2) to determine a total line wiring power loss drift (P_DRIFT). Equation 10 shown below provides an equation for calculating the total line wiring power loss drift (P_DRIFT):

$$P_{DRIFT} = P_{t2} - P_{t1} \qquad \text{Eq. 10}$$

The controller 58 may also use Equation 10 and substitute PN calculated in Equation 6 to determine a neutral wiring power loss drift, or substitute PH calculated in Equation 5 to determine a hot wiring power loss drift.

A system for evaluating performance of a supply circuit for electric vehicle charging is illustrated in accordance with another embodiment and is generally indicated by numeral 110. The system 110 includes a simplified control circuit 156, which includes a current sensor 166 for measuring line current (IL) and a single voltage sensor 162 for measuring the line voltage (VL). The voltage sensor for measuring the neutral voltage is not included in this embodiment, and therefore shown in phantom in FIG. 4.

The system 110 includes a controller 158 in electrical communication with the voltage sensor 162 and the current sensor 166. The controller 158 may analyze the measurement signals at no load, and load conditions to evaluate performance. The controller 158 activates a switch 160 to an opened position, to acquire open circuit, or no load (NL) measurement signals. The controller 158 also activates the switch 160 to a closed position, and commands the vehicle control (shown in FIG. 2) to set a predetermined load (L) or charging current (e.g., 11 A) to acquire load (L) measurement signals.

The system 110 may determine the hot wiring resistance (RH) and the neutral wiring resistance (RN) by comparing the line voltage (VL) to the line current (IL). This measurement is possible because the hot conductor and the neutral conductor are along a common path and therefore should have the same resistance. Equation 11 shown below provides an equation for calculating the hot wiring resistance (RH) and the neutral wiring resistance (RN):

$$RH = RN = \frac{VL}{IL*2} \quad \text{Eq. 11}$$

Figure 5:
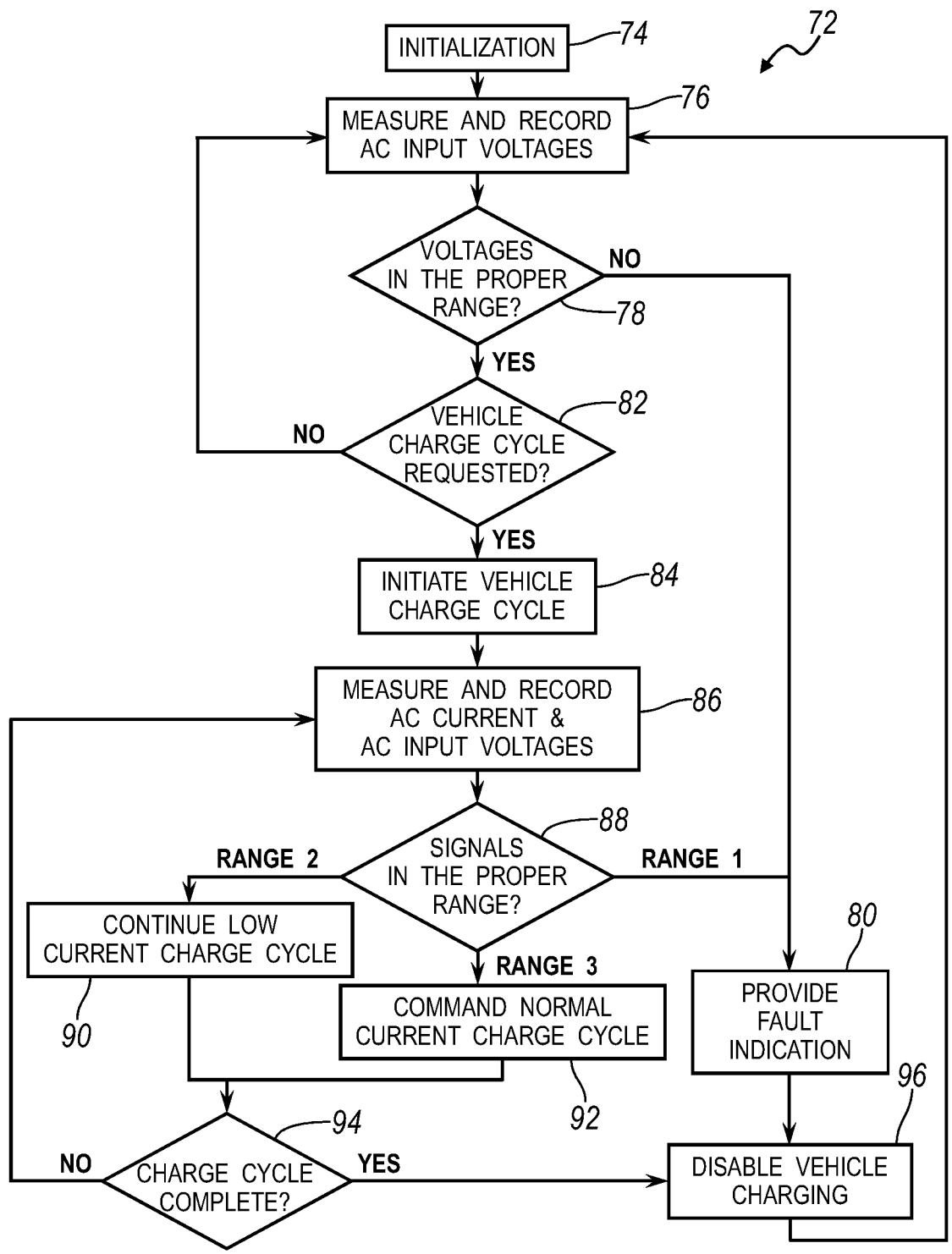
FIG. 5 is a flow chart illustrating operation of a method for evaluating performance of a charging circuit, performed by the system of FIG. 1.

FIG. 5 illustrates a flowchart describing operation of a method 72 for evaluating performance of the supply circuit 34 in accordance with an embodiment of the present invention. In operation 74, the controller 58, 158 initializes, which includes establishing communication with the vehicle control 44 and the control circuit 56, 156. Additionally, the controller 58, 158 activates the switch 60, 160 to an opened position by transmitting a control signal (CTRL) to the switch 60, 160.

In operation 76, the controller 58, 158 receives and records open circuit, or no load (NL) measurement signals from the control circuit 56, 156. The measurement signals include the line voltage signal (VL_NL) and may also include the neutral voltage signal (VN_NL).

In operation 78, the controller 58, 158 determines if the voltage signals received in operation 76 (VL_NL and VN_NL) are within the proper range. The controller 58, 158 may be configured with predetermined data of proper ranges for the line voltage (VL_NL*) and the neutral voltage (VN_NL*) at no load. For example, the predetermined data may indicate that the proper range for the line voltage at no load (VL_NL*) is 120 Vrms+/−10 Vrms. Additionally, the predetermined data may indicate that the proper range for the neutral voltage at no load (VN_NL*) is 0 Vrms+/−10 Vrms. For clarity, predetermined data described in the present disclosure is identified with an asterisk (*).

If the controller 58, 158 determines in operation 78 that NO, the voltages are not within the proper range, then the controller 58, 158 proceeds to step 80 and provides a fault indication. The controller 58, 158 may provide the fault indication by transmitting a corresponding pilot signal (CPLT) to the vehicle control 44.

If the controller 58, 158 determines in operation 78 that YES, the voltages are within the proper range, then the controller 58, 158 proceeds to operation 82. In operation 82, the controller 58, 158 checks to see if the vehicle control 44 has requested a charge cycle over the pilot signal (CPLT). If no charge cycle has been requested, the controller returns to operation 76.

If the controller 58, 158 determines that YES, a charge cycle has been requested, then the controller proceeds to step 84 and initiates a vehicle charge cycle. The controller 58, 158 initiates the vehicle charge cycle by closing the switch 60, 160 and transmitting a pilot signal (CPLT) to the vehicle control 44 that is indicative of a low current allowable charge (e.g., 6A or 11A).

In operation 86, the controller 58, 158 receives and records closed circuit, or load (L) measurement signals from the control circuit 56, 156. The load (L) measurement signals include the line voltage signal (VL_L), the neutral voltage signal (VN_L), and the line current signal (I_L)

In operation 88, the controller 58, 158 determines if the measurement signals received in step 86 (VL_L, VN_L and I_L) are within the proper range. The controller 58, 158 utilizes equations 1-11 to compare the no load measurement signals recorded in operation 76, to the load measurement signals recorded in operation 86, to determine resistance and power values for the charging circuit 48. The controller 58 compares the calculated resistance and power values to predetermined data to determine if the signals are within a proper range, which is defined by predetermined data.

The controller 58, 158 may be configured with predetermined data of proper ranges for the resistance and power loss values for the charging circuit 48. For example, the controller 58, 158 may include predetermined data that indicates that the proper range for the line resistance of each of the hot, neutral, and ground conductors of the supply circuit 34 (R1H*, R1N*, R1G*, R2H*, R2N*, R2G*, R3H*, R3N*, R3G*) is 0.02 to 0.4 ohms, at a load of 11A along 14 AWG conductors, each having a length of five to one hundred thirty five feet. The predetermined resistance data may also indicate that the proper range for the line resistance of each of the hot, neutral, and ground conductor of the vehicle circuit 38 combined with the charging cable 18 (R4H*, R4N*, R4G*) is 0.151 ohms, at a load of 11A along 14 AWG conductors, each having a length of thirty feet. From this predetermined data, the controller 58, 158 may calculate an overall resistance range for each conductor of the charging circuit 48 by adding the resistance values in series. Equation 12 shown below provides an equation for calculating the total neutral wire resistance from the predetermined data (RN*):

$$RN^* = (RN1^* + RN2^* + RN3^*) + (R4N^*)$$

$$RN^* = (0.02 \text{ to } 0.4 \text{ ohms}) + (0.151 \text{ ohms})$$

$$RN^* = (0.171 \text{ to } 0.551 \text{ ohms}) \quad \text{Eq. 12}$$

The controller 58, 158 evaluates the supply circuit 34 performance by determining whether the measured signals (RN from Eq. 2) are within the predetermined range (RN*). The controller 58, 158 may also include predetermined data indicating a threshold value within the range for differentiating between allowable charging currents.

For example, the controller 58, 158 may include predetermined data for the resistance range of the neutral conductor that is separated into three ranges with a threshold value of 0.4 ohms. The controller 58, 158 may determine a first range, where there is no allowable charge if RN exceeds the maximum resistance value: (RANGE_1*: If RN>0.551 ohms, then no allowable charge). The controller 58, 158 may determine a second range, where there is a low current allowable charge if RN exceeds the threshold value, but is below the maximum resistance value: (RANGE_2*: If 0.4<RN<0.551 ohms, then low current allowable charge). The controller 58, 158 may determine a third range, where there is a normal current allowable charge when RN is less than the threshold value: (RANGE_3*: RN<0.4 ohms).

If the controller 58, 158 determines in operation 88 that the signals are in Range 1* (e.g., RN>0.551 ohms), then the controller 58, 158 proceeds to operation 80 and provides a fault indication. The controller 58, 158 may provide the fault indication by transmitting a corresponding pilot signal (CPLT) to the vehicle control 44.

If the controller 58, 158 determines in operation 88 that the signals are in Range 2* (e.g., 0.4<RN<0.551 ohms), then the controller 58, 158 proceeds to operation 90 and continues a low current charge cycle. The controller 58, 158 may continue a low current charge cycle by transmitting a pilot signal (CPLT) to the vehicle control 44 indicative of a low current (6A) allowable charge.

If the controller 58, 158 determines in operation 88 that the signals are in Range 3* (e.g., 0.171<RN<0.4 ohms), then the controller 58, 158 proceeds to operation 92 and commands a normal current charge cycle. The controller 58, 158 may command a normal current charge cycle by transmitting a pilot signal (CPLT) to the vehicle control 44 indicative of a normal current (11-16A) allowable charge.

After operations 90 and 92 the controller 58, 158 proceeds to operation 94 and determines if the charge cycle is complete. The controller 58, 158 may determine if the charge cycle is complete by monitoring the pilot signal (CPLT) received from the vehicle control 44 for a responsive signal. If the controller 58, 158 determines that NO, the charge cycle is not complete, then the controller 58, 158 will return to operation 86.

In operation 94, once the controller 58, 158 determines that YES, the charge cycle is complete, the controller 58, 158 will proceed to operation 96 and disable vehicle charging. The controller 58, 158 may disable vehicle charging by activating the switch 60, 160 to an opened position by transmitting a control signal (CTRL) to the switch 60, 160. After the controller 58, 158 disables vehicle charging in operation 96, the controller returns to operation 76.

While embodiments of the present invention are described above, it is not intended that these embodiments describe all possible forms of the present invention. Rather, the words used in the specification are words of description rather than limitation, and various changes may be made without departing from the spirit and scope of the present invention. Additionally, the features of various implementing embodiments may be combined to form further embodiments of the present invention.

What is claimed:

1. A system for evaluating performance of a supply circuit for electric vehicle charging, the system comprising:
    a charging cable for electrically connecting between a supply circuit and a vehicle circuit, the charging cable including a hot conductor, a neutral conductor and a ground conductor;
    at least one voltage sensor for providing at least one of a line voltage signal and a neutral voltage signal, the line voltage signal being indicative of a voltage potential between the hot conductor and the neutral conductor, and the neutral voltage signal being indicative of a voltage potential between the neutral conductor and the ground conductor;
    a current sensor for providing a line current signal indicative of a current along at least one of the hot conductor and the neutral conductor; and
    a controller in electrical communication with the at least one voltage sensor, and the current sensor, the controller configured to:
        receive the line current signal and at least one of the line voltage signal and the neutral voltage signal, and
        compare at least one of the line voltage signal, the neutral voltage signal, and the line current signal to predetermined data to evaluate supply circuit performance.

2. The system of claim 1 wherein the predetermined data includes resistance values for residential wiring of the supply circuit.

3. The system of claim 1 further comprising a vehicle control in electrical communication with the controller for setting a charging current through the charging cable in response to a pilot signal.

4. The system of claim 3 wherein the controller is further configured to:
    determine an allowable charge in response to the supply circuit performance; and
    transmit the pilot signal indicative of the allowable charge to the vehicle control.

5. The system of claim 4 further comprising a switch in electrical communication with the controller for selectively disconnecting the vehicle circuit from the supply circuit in response to a control signal received from the controller and wherein the controller is further configured to:
    monitor the line current signal; and
    activate the switch to an opened position when the line current signal exceeds the allowable charge.

6. A system for evaluating performance of a supply circuit for electric vehicle charging, the system comprising:
    a controller in electrical communication with a control circuit having electrical sensors in communication with a charging cable electrically connected to the supply circuit, wherein the charging cable has a hot conductor, a neutral conductor, and a ground conductor, the controller configured to:
        receive input signals from the electrical sensors including a line current signal indicative of a current along at least one of the hot conductor and the neutral conductor, and at least one of a line voltage signal and a neutral voltage signal, the line voltage signal being indicative of a voltage potential between the hot conductor and the neutral conductor, and the neutral voltage signal being indicative of a voltage potential between the neutral conductor and the ground conductor, and
        compare at least one of the line voltage signal, the neutral voltage signal, and the line current signal to predetermined data to evaluate supply circuit performance.

7. The system of claim 6 wherein the control circuit further comprises a switch configured to electrically disconnect the charging cable from the supply circuit and wherein the controller is further configured to:
    activate the switch between an opened position in which the charging cable is electrically disconnected from the supply circuit and a closed position in which the charging cable is electrically connected to the supply circuit;
    analyze the input signals to determine a no load line voltage and a no load neutral voltage after activating the switch to the opened position; and
    compare the no load line voltage and the no load neutral voltage to predetermined data to evaluate a voltage range.

8. The system of claim 7 wherein the controller is further configured to:
    receive a charge request signal from a vehicle control; and activate the switch to the closed position in response to the voltage range and the vehicle cycle charge request.

9. The system of claim 8 wherein the controller is further configured to:
analyze the input signals received when the switch is in the closed position to determine a load line voltage, a load neutral voltage, and a load line current;
compare at least one of the no load line voltage, and the no load neutral voltage to at least one of the load line voltage, the load neutral voltage and the load line current to determine a resistance; and
compare the resistance to predetermined data to evaluate supply circuit performance.

10. The system of claim 6 wherein the controller is further configured to:
determine an allowable charge in response to the supply circuit performance; and
transmit a pilot signal to a vehicle control indicative of the allowable charge.

11. A method for evaluating performance of a supply circuit for electric vehicle charging, the method comprising:
establishing an electrical connection between a vehicle circuit and a supply circuit for an external Alternating Current (AC) power supply, wherein the electrical connection includes a hot, neutral, and ground conductor;
transmitting a control signal to activate a switch disposed along the electrical connection for selectively initiating vehicle charging;
receiving input signals including a line current signal indicative of a current along at least one of the hot conductor and the neutral conductor, and at least one of a line voltage signal and a neutral voltage signal, the line voltage signal being indicative of a voltage potential between the hot conductor and the neutral conductor, and the neutral voltage signal being indicative of a voltage potential between the neutral conductor and the ground conductor; and
comparing at least one of the input signals to predetermined resistance data for evaluating supply circuit performance.

12. The method of claim 11 wherein evaluating supply circuit performance further comprises comparing the line voltage signal taken when the switch is open to the line voltage signal and the line current signal taken when the switch is closed in order to determine a total line wiring resistance.

13. The method of claim 12 further comprising comparing the total line wiring resistance to predetermined resistance data to determine if the total line wiring resistance is within an acceptable range.

14. The method of claim 12 wherein evaluating supply circuit performance further comprises comparing the line current signal taken when the switch is closed to the total line wiring resistance in order to determine a total line power loss.

15. The method of claim 14 further comprising:
determining a second total line power loss after a predetermined time interval; and
comparing the second total line power loss to the total line power loss in order to determine a total line power loss drift.

16. The method of claim 15 further comprising:
determining a first allowable charge in response to the total line power loss;
transmitting a first pilot signal indicative of the first allowable charge to a vehicle control;
determining a second allowable charge in response to the total line power loss drift; and
transmitting a second pilot signal indicative of the second allowable charge to the vehicle control.

17. The method of claim 11 wherein evaluating supply circuit performance further comprises comparing the neutral voltage signal taken when the switch is open, to the neutral voltage signal and the line current signal taken when the switch is closed in order to determine a neutral wiring resistance.

18. The method of claim 11 wherein evaluating supply circuit performance further comprises:
comparing the line voltage signal taken when the switch is opened, to the line voltage signal and the line current signal taken when the switch is closed, to determine a total line wiring resistance;
comparing the neutral voltage signal taken when the switch is opened, to the neutral voltage signal and the line current signal taken when the switch is closed, to determine a neutral wiring resistance; and
comparing the total line wiring resistance to the neutral wiring resistance in order to determine a hot wiring resistance.

19. The method of claim 18 further comprising comparing the hot wiring resistance to the neutral wiring resistance in order to determine a resistance balance ratio.

20. The method of claim 11 wherein evaluating supply circuit performance further comprises:
comparing at least two of the line current signal, the line voltage signal, and the neutral voltage signal, to determine a first resistance;
comparing at least two of the line current signal, the line voltage signal, and the neutral voltage signal, taken after a predetermined time interval, to determine a second resistance; and
comparing the first resistance to the second resistance in order to determine a resistance drift.

* * * * *